United States Patent
Hsin et al.

(10) Patent No.: US 8,598,639 B2
(45) Date of Patent: Dec. 3, 2013

(54) SI PHOTODIODE WITH SYMMETRY LAYOUT AND DEEP WELL BIAS IN CMOS TECHNOLOGY

(75) Inventors: Yue-Ming Hsin, Tainan (TW); Fang-Ping Chou, New Taipei (TW); Ching-Wen Wang, Changhua County (TW); Guan-Yu Chen, Taichung (TW)

(73) Assignee: National Central University, Taoyuan (TW)

( * ) Notice: Subject to any disclaimer, the term of this patent is extended or adjusted under 35 U.S.C. 154(b) by 259 days.

(21) Appl. No.: 13/039,280

(22) Filed: Mar. 2, 2011

(65) Prior Publication Data

US 2012/0175690 A1    Jul. 12, 2012

(30) Foreign Application Priority Data

Jan. 6, 2011   (TW) .................................. 100100499

(51) Int. Cl.
*H01L 31/113* (2006.01)
(52) U.S. Cl.
USPC ......................................... 257/292; 257/290
(58) Field of Classification Search
USPC .................................. 257/E31.084, 290–294
See application file for complete search history.

(56) References Cited

U.S. PATENT DOCUMENTS

| 6,713,796 | B1 | 3/2004 | Fox |
| 2006/0108657 | A1 | 5/2006 | Raynor |
| 2010/0001929 | A1 | 1/2010 | Kawabe |

OTHER PUBLICATIONS

Myung-Jae Lee, Woo-Young Choi, "A silicon avalanche photodetector fabricated with standard CMOS technology with over 1THz gain-bandwidth product," Optics Express, Nov. 8, 2010, vol. 18, No. 23.
"Office Action of Taiwan Counterpart Application", issued on Jun. 21, 2013, p1-p5, in which the listed references were cited.

*Primary Examiner* — Cuong Q Nguyen
(74) *Attorney, Agent, or Firm* — Jianq Chyun IP Office

(57) ABSTRACT

A silicon photodiode with symmetry layout and deep well bias in CMOS technology is provided. The silicon photodiode includes a substrate, a deep well, and a PN diode structure. The deep well is disposed on the substrate, where an extra bias is applied to the deep well. The region surrounded by the deep well forms the main body of the silicon photodiode. The PN diode structure is located in the region surrounded by the deep well, where the silicon photodiode has a symmetry layout. The deep well is adopted when fabricating the silicon photodiode, and the extra bias is applied to the deep well to eliminate the interference and effect of the substrate absorbing light, and further greatly improve speed and bandwidth. Furthermore, the silicon photodiode has a symmetry layout, so that uniform electric field distribution is achieved, and the interference of the substrate noise is also reduced.

13 Claims, 11 Drawing Sheets

SI PHOTODIODE WITH SYMMETRY LAYOUT AND DEEP WELL BIAS IN CMOS TECHNOLOGY

CROSS-REFERENCE TO RELATED APPLICATION

This application claims the priority benefit of Taiwan application serial no. 100100499, filed Jan. 6, 2011. The entirety of the above-mentioned patent application is hereby incorporated by reference herein and made a part of this specification.

BACKGROUND OF THE INVENTION

1. Field of the Invention

The invention relates to a photodiode and more particularly to a silicon photodiode with symmetry layout and deep well bias in CMOS technology.

2. Description of Related Art

Nowadays, Si photodiodes (PDs) fabricated by complementary metal-oxide-semiconductor (CMOS) become popular in the application of optical communication at near-infrared wavelengths (e.g. 850-nm) due to its low cost and possible integration with receivers. However, light penetration depth of Si at 850-nm is larger than 10 µm that results in low responsivity for a surface PD. Moreover, carriers generated from bulk silicon substrate slowly diffuse to be collected and significantly affect the response performance. The resulting bandwidth is limited.

It is possible to improve both responsivity and bandwidth by avalanche diode structure. However, the response time is still limited by the slow diffusion carriers in the substrate. As a result, silicon photodiodes fabricated on silicon-on-insulator (SOI) substrates present the best performance, but the cost and popularity of SOI wafers are two issues.

SUMMARY OF THE INVENTION

The invention is directed to a silicon photodiode fabricated in CMOS technology, where the novel structure eliminates the slow diffusion carriers, increases the frequency bandwidth, and includes deep well bias and symmetry layout, such that the response speed of the silicon photodiode is increased effectively and the fabrication cost is greatly reduced.

The invention is directed to a silicon photodiode with a symmetry layout and a deep well bias in CMOS technology. The silicon photodiode includes a substrate, a deep well, and a PN-diode structure. The deep well is disposed on the substrate, where a bias is provided to the deep well. A region surrounded by the deep well forms a main body of the silicon photodiode. The PN diode structure is disposed in the region surrounded by the deep well. The silicon photodiode has a symmetrical surrounding structure.

In one embodiment of the invention, the substrate is a P-type substrate.

In one embodiment of the invention, the deep well is an N-type deep well.

In one embodiment of the invention, an N-type well is not connected to the N-type deep well inside the main body of the silicon photodiode.

In one embodiment of the invention, the main body of the silicon photodiode includes an N-type implant region, a P-type substrate region, and a P-type implant region.

In one embodiment of the invention, the main body of the silicon photodiode includes an N-type implant region, a P-type well, and a P-type implant region.

In one embodiment of the invention, the main body of the silicon photodiode includes an N-type implant region, a P-type substrate region, a P-type well, and a P-type implant region.

In one embodiment of the invention, the symmetrical surrounding structure of the silicon photodiode is a symmetrical polygonal surrounding structure.

In one embodiment of the invention, the symmetrical surrounding structure of the silicon photodiode is a symmetrical octagonal surrounding structure.

In one embodiment of the invention, the symmetrical surrounding structure of the silicon photodiode is a circular surrounding structure.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Silicon photodiodes are one of the most important devices in optical communication and are responsible for converting optical signals into electrical signals. However, when the material of a lower substrate of a silicon photodiode absorbs the absorption wavelengths of the silicon photodiode, the slow diffusion carriers from the substrate then becomes a problem which leads to slow response speed.

In an exemplary embodiment of the invention, the silicon photodiode adopts a deep well fabrication step and eliminates the effects and interferences generated after the substrate absorbs light by providing an extra deep well bias, such that the response speed and the frequency bandwidth are greatly improved. Moreover, in an exemplary embodiment of the invention, the silicon photodiode has a symmetrical surrounding structure for obtaining uniform electric field distribution. The interference from the noise of the substrate of the silicon photodiode is also reduced effectively.

Figure 1:
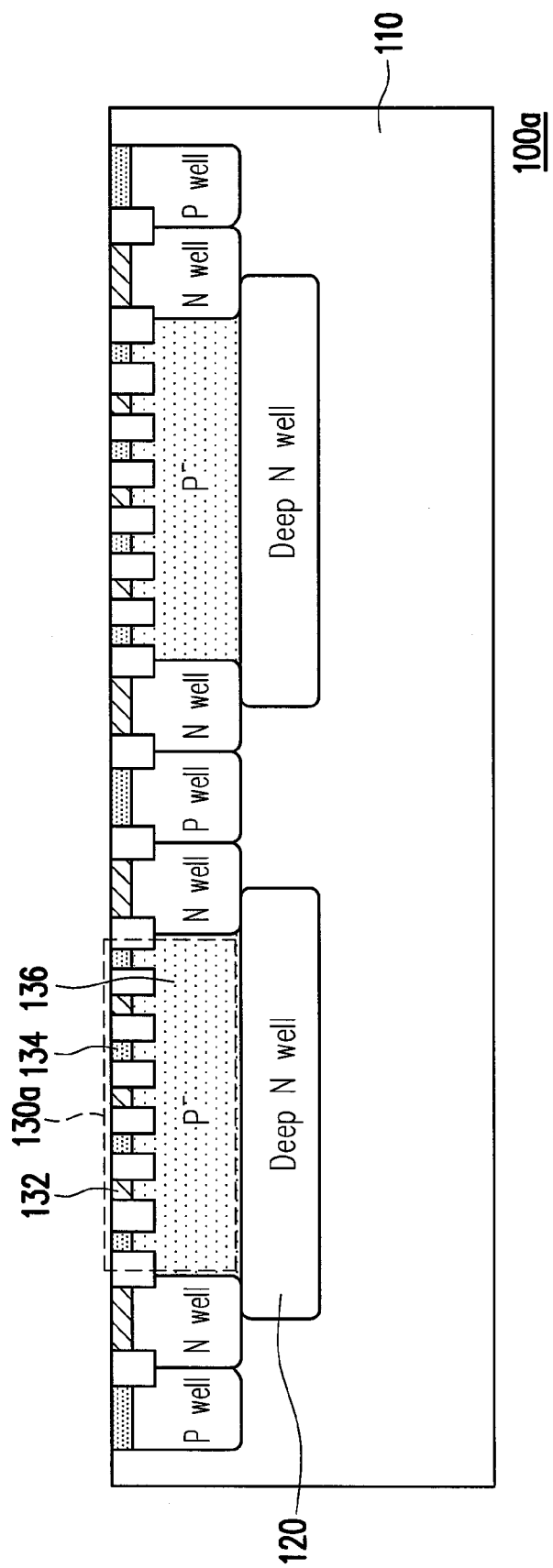
FIG. 1 is a schematic cross-sectional diagram of a silicon photodiode according to an embodiment of the invention.

FIG. 1 is a schematic cross-sectional diagram of a silicon photodiode according to an embodiment of the invention. Referring to FIG. 1, a silicon photodiode 100a in the present embodiment includes a substrate 110, a deep well 120, and a PN diode structure 130a inside the deep well 120. In the present embodiment, the silicon photodiode 100a is fabricated with, for example, 0.18-μm standard CMOS fabrication. The substrate 110 is, for example, a P-type substrate. The deep well 120 disposed on the substrate 110 is, for example, an N-type deep well. A region surrounded by the deep well 120 forms a main body of the silicon photodiode 100a. Herein, the main body of the silicon photodiode 110a includes an N-type implant region 132, a P-type substrate region 136, and a P-type implant region 134. In the present embodiment, the P-type substrate region 136 is a lightly-doped P-type region.

It should be noted that in the operation of the silicon photodiode 100a in the present embodiment, a bias is provided to the deep well 120 to eliminate the effect and interference generated after the substrate 110 absorbs the light. Consequently, the response speed and the frequency bandwidth can be improved greatly.

Figure 2A:
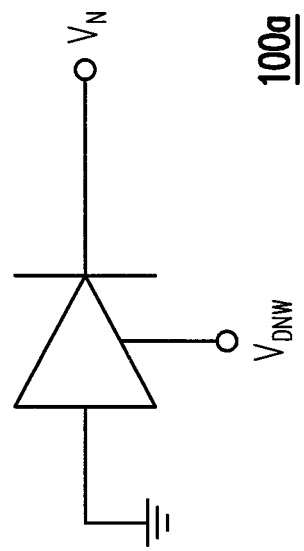
FIGS. 2A and 2B illustrate equivalent circuit diagrams of two different bias schemes in silicon photodiodes.
Figure 2B:
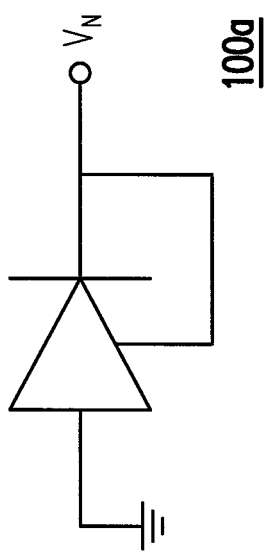

FIGS. 2A and 2B illustrate equivalent circuit diagrams of two different bias schemes in silicon photodiodes. Referring to FIGS. 2A and 2B, in these two schemes, a p-polarity (i.e. anode) of the silicon photodiode 100a is connected to the ground and an n-polarity (i.e. cathode) is biased to a bias VN. In the bias scheme in FIG. 2A, the deep well 120 is connected to the bias VN of the silicon photodiode 100a. That is, an electrode of the deep well 120 and an electrode of the N-type implant region 132 of the main body of the silicon photodiode 100a are connected to each other.

In the bias scheme with an extra bias VDNW shown in FIG. 2B, the deep well 120 and the n-polarity of the silicon photodiode 100a are biased to VDNW and VN respectively. That is, the electrode of the deep well 120 and the electrode of the N-type implant region 132 of the main body of the silicon photodiode 100a are biased respectively such that an extra deep well bias scheme is provided. Herein, the VDNW biased to the deep well 120 increases the depletion in the deep well 120 so as to block and collect the slow diffusion carriers. Further, in the present embodiment, the bias VN is a positive bias, so that the PN diode structure 130a is in a reverse bias state for collecting the carriers generated from the irradiation. Accordingly, the silicon photodiode 100a adopts the deep well fabrication step and eliminates the effects and interferences generated after the substrate 110 absorbs light by providing an extra deep well bias, such that the response speed and the frequency bandwidth are greatly improved.

Figure 3:
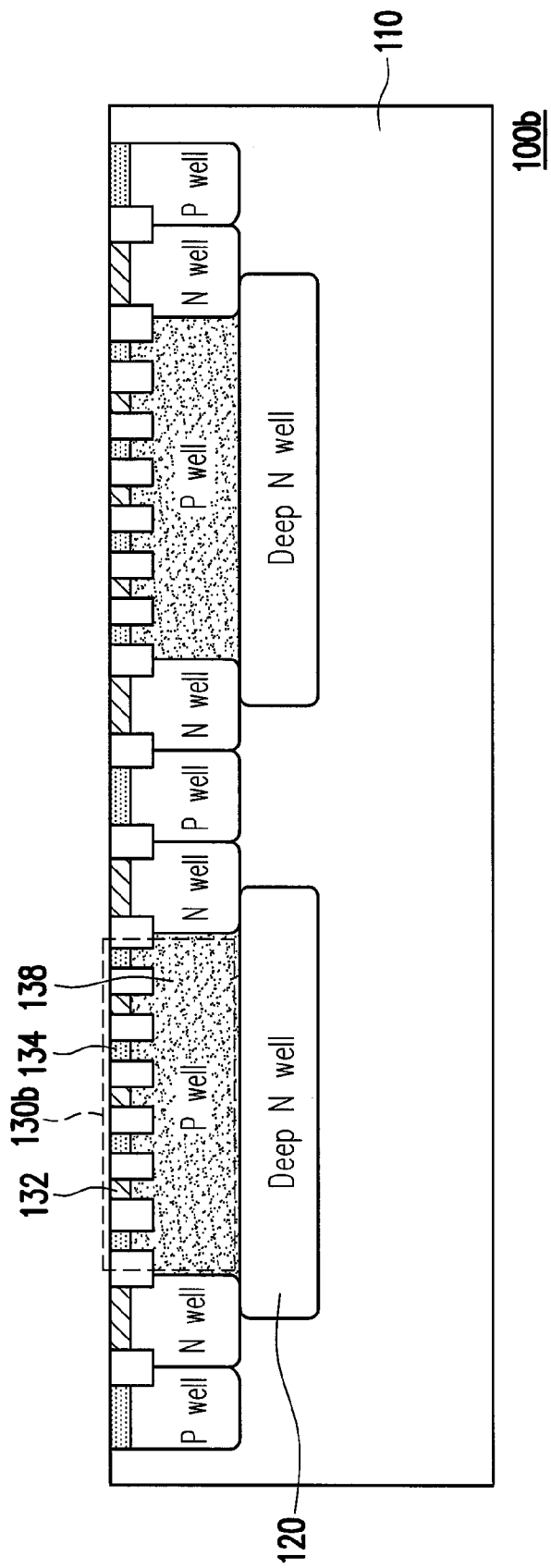
FIG. 3 is a schematic cross-sectional diagram of a silicon photodiode according to another embodiment of the invention.

FIG. 3 is a schematic cross-sectional diagram of a silicon photodiode according to another embodiment of the invention. Referring to FIGS. 1 and 3, a silicon photodiode 100b of the present embodiment is similar to the silicon photodiode 100a in FIG. 1. The difference between the two is that, for example, a main body of the silicon photodiode 100b includes an N-type implant region 132, a P-type well 138, and a P-type implant region 134. Similarly, in the present embodiment, a PN diode structure 132b is surrounded by the deep well 120. The deep well 120 of the silicon photodiode 100b is also operated in the manner of extra deep well bias and the scheme thereof is as shown in FIG. 2B. The details are thus omitted hereinafter.

Figure 4A:
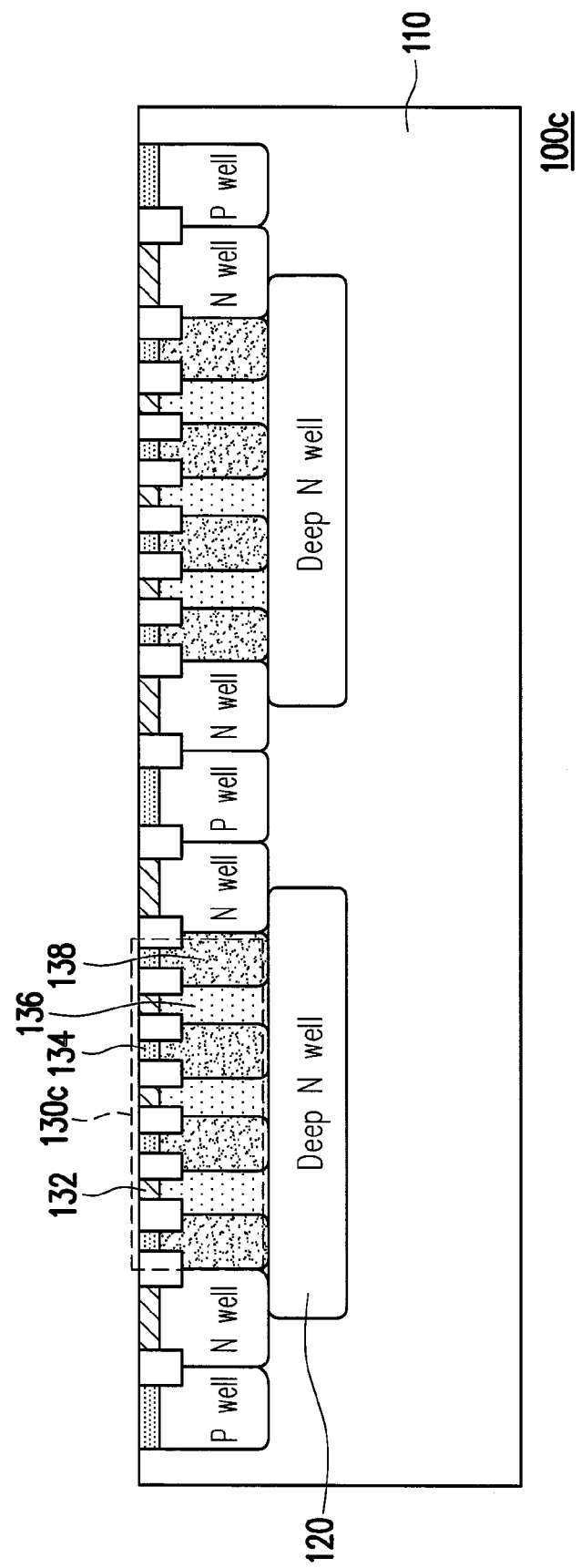
FIG. 4A is a schematic cross-sectional diagram of a silicon photodiode according to another embodiment of the invention.
Figure 4B:
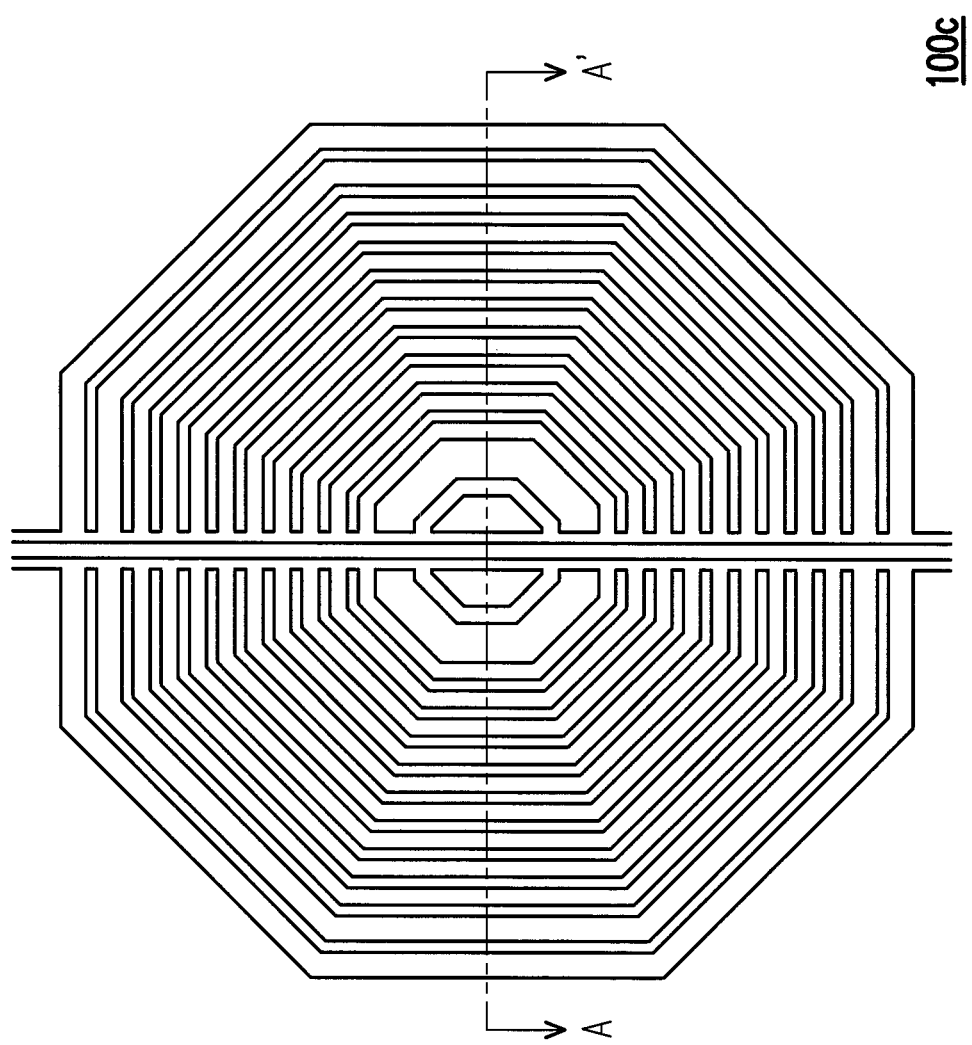
FIG. 4B shows a top view of the silicon photodiode in FIG. 4A.

FIG. 4A is a schematic cross-sectional diagram of a silicon photodiode according to another embodiment of the invention. FIG. 4B shows a top view of the silicon photodiode in FIG. 4A. Here, FIG. 4A illustrates a schematic cross-sectional view taken along line AA' in FIG. 4B. Referring to FIGS. 1, 4A and 4B, a silicon photodiode 100c of the present embodiment is similar to the silicon photodiode 100a in FIG. 1. The difference between the two is that, for example, a main body of the silicon photodiode 100c includes the N-type implant region 132, a P-type substrate region 136, the P-type well 138, and the P-type implant region 134. Similarly, in the present embodiment, a PN diode structure 130c is surrounded by the deep well 120. The deep well 120 of the silicon photodiode 100c is also operated in the manner of extra deep well bias and the scheme thereof is as depicted in FIG. 2B. The details are thus omitted hereinafter.

It should be illustrated that other than the design of the bias, the silicon photodiode 100c of the present embodiment has a symmetrical surrounding layout structure as depicted in FIG. 4B. Here, the surrounding layout structure is shown in a symmetrical octagon as an example; however, the invention is not limited thereto. The design of the symmetrical octagon improves the non-uniform distribution of conventional electric field and provides a symmetrical and uniformly distributed electric field. A center of the octagon optionally exposes the P-type well to absorb a hole or the entire deep well 120 is un-segmented to increase an irradiation area. The silicon photodiode 100c with a symmetrical octagonal shape combines a bias design of FIG. 2B to attain superior frequency bandwidth, and the octagonal silicon photodiode can also adopt a polygonal or a circular design and the invention is not limited thereto.

It should be noted that in an exemplary embodiment of the invention, although the symmetrical surrounding structure of the silicon photodiode 100c is depicted by the top view in FIG. 4B, the silicon photodiodes 100a and 110b in FIGS. 1 and 3 also includes symmetrical surrounding structures for uniform electric field distribution so as to increase the response speed.

It should be illustrated that in exemplary embodiments of the invention, the silicon photodiode can be constituted with a PN junction. The combination in structure can thus be randomly chosen, such as structural combinations of a P-type well combined with an N-type well, a P-type well combined with an N-type implant region, a P-type implant region combined with an N-type well, a P-type implant region combined with an N-type implant region, and so on. In order to eliminate the slow diffusion carriers, the N-type well and the N-type deep well inside different structural combinations of the silicon photodiode are not connected to each other.

Figure 5A:
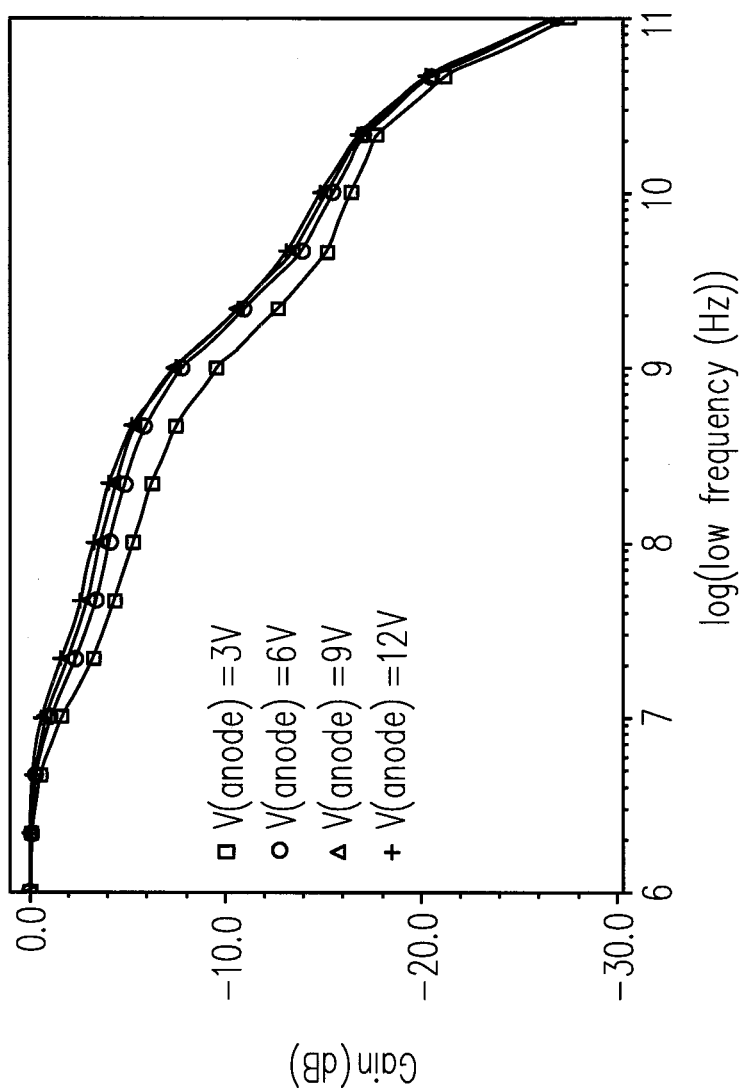
FIGS. 5A and 5B respectively illustrate results of optical frequency response of a silicon photodiode 100a in FIG. 1 under two different bias schemes in FIGS. 2A and 2B.
Figure 5B:
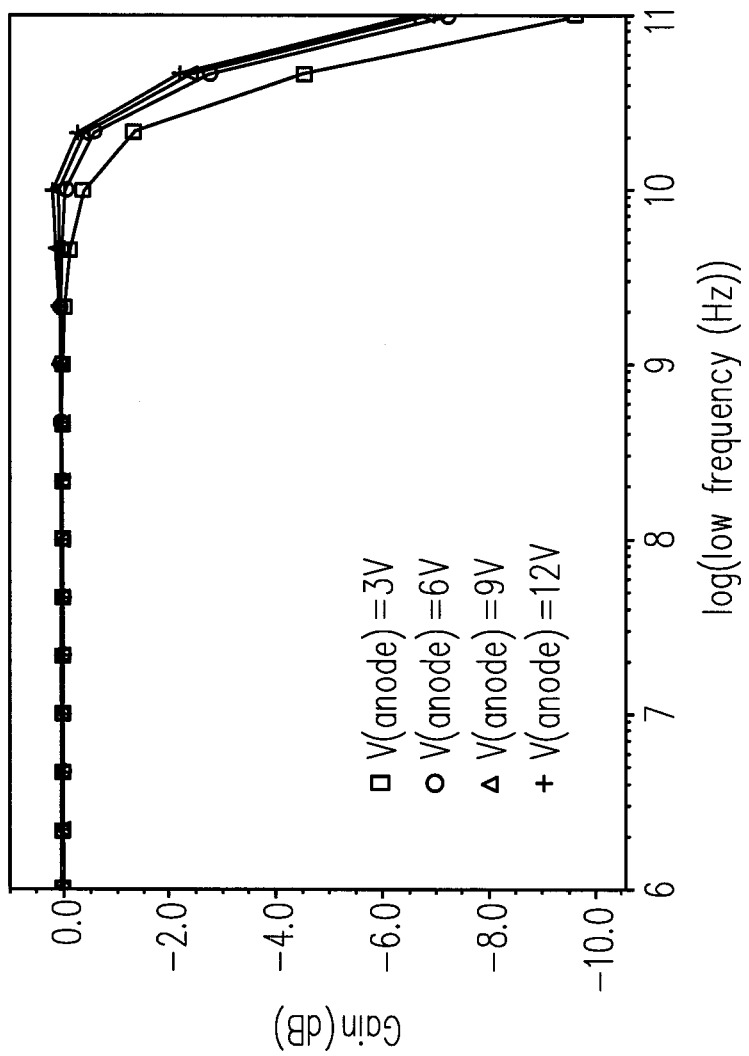
Figure 6A:
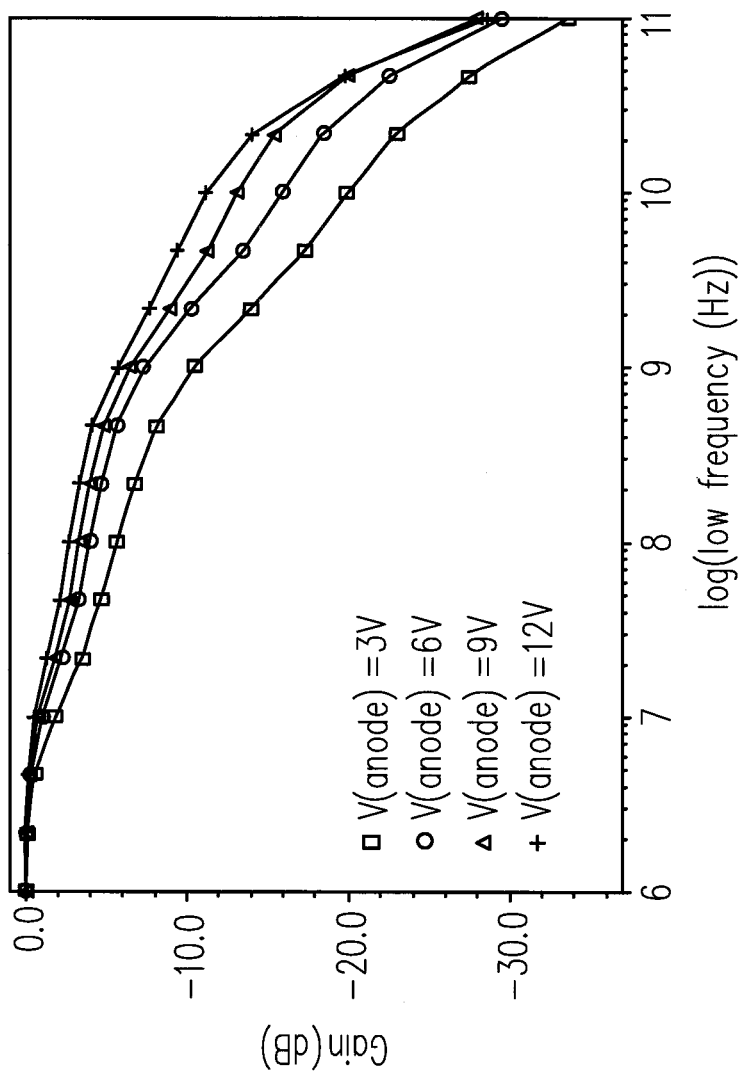
FIGS. 6A and 6B respectively illustrate results of optical frequency response of a silicon photodiode 100b in FIG. 3 under two different bias schemes in FIGS. 2A and 2B.
Figure 6B:
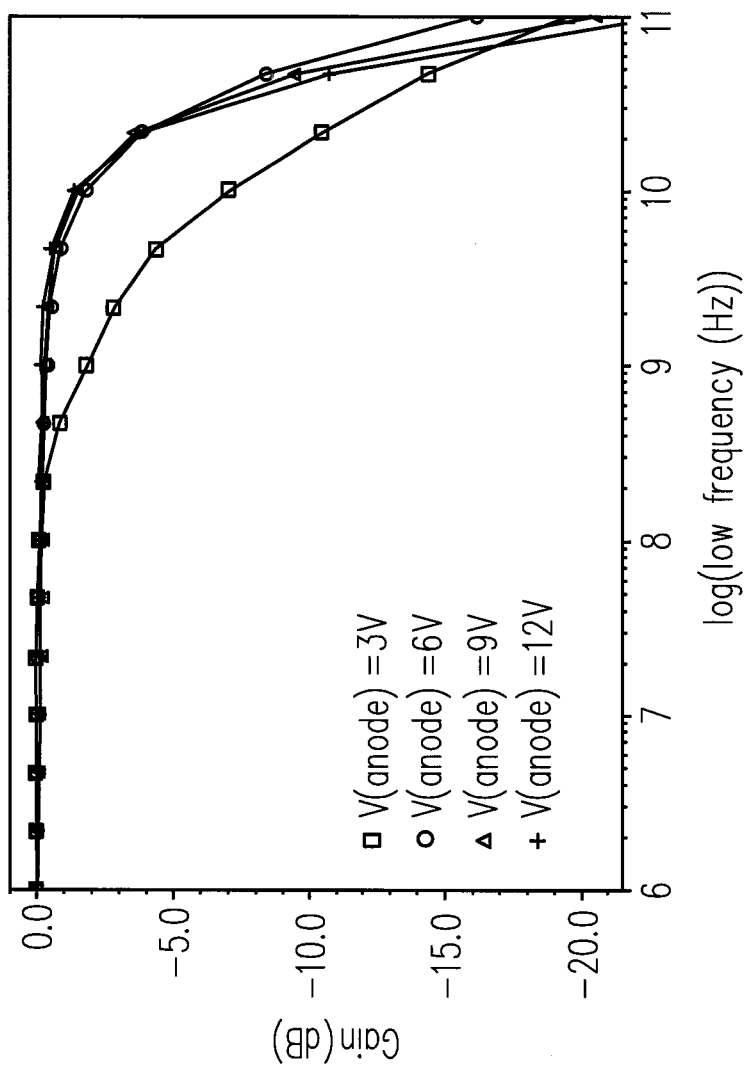
Figure 7A:
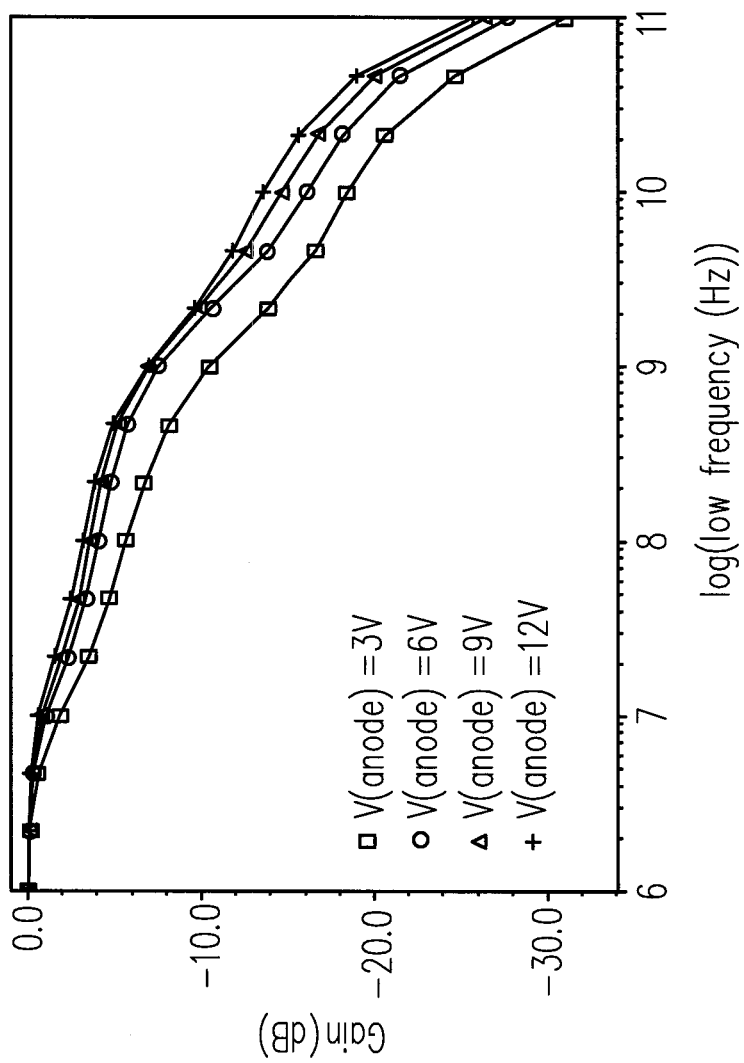
FIGS. 7A and 7B respectively illustrate results of optical frequency response of a silicon photodiode 100c in FIG. 4A under two different bias schemes in FIGS. 2A and 2B.
Figure 7B:
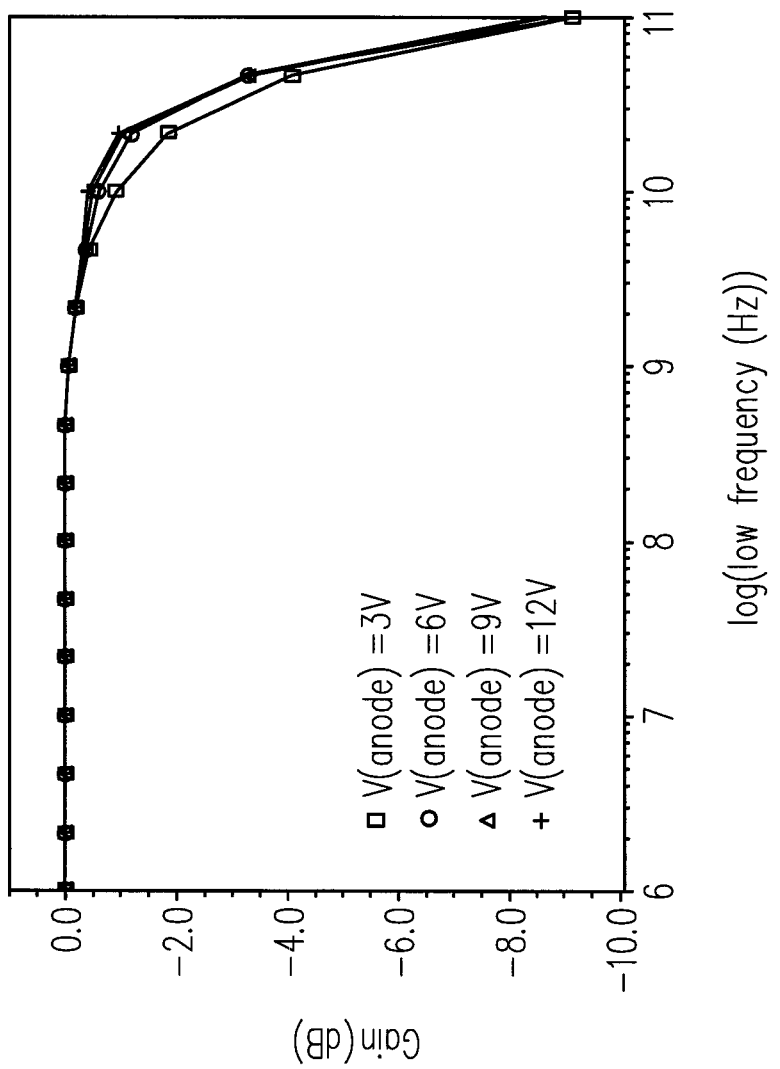

FIGS. 5A and 5B respectively illustrate results of optical frequency response of the silicon photodiode 100a in FIG. 1 under two different bias schemes in FIGS. 2A and 2B. FIGS. 6A and 6B respectively illustrate results of optical frequency response of the silicon photodiode 100b in FIG. 3 under two different bias schemes in FIGS. 2A and 2B. FIGS. 7A and 7B respectively illustrate results of optical frequency response of the silicon photodiode 100c in FIG. 4A under two different bias schemes in FIGS. 2A and 2B. Herein, a wavelength of 850 nm is input into the simulation conditions of the optical frequency response and lights of different frequencies are generated after the modulation. Each of the silicon photodiodes are irradiated with a flow rate of 1×1020 photons/cm2-sec with a height of 0.5 μm, and the irradiation range equals to the width of each of the silicon photodiodes. The frequency responses output under different frequencies can simulate the −3 dB frequency bandwidth of each of the silicon photodiode.

As shown from the simulation results in FIGS. 5A to 7B, adopting the bias scheme depicted in FIG. 2B allows a maximum frequency bandwidth of 50 GHz, where the simulation frequency bandwidth of the bias schemes connected to each other in FIG. 2A is only 0.2 GHz. Therefore, each of the silicon photodiodes can attain superior frequency bandwidth with the bias design shown in FIG. 2B. Additionally, the depletion region increases with the increasing inverse bias. The frequency bandwidth thus increases and the optical frequency response also increases.

In summary, in the exemplary embodiments of the invention, the silicon photodiode adopts a deep well fabrication step and eliminates the effects and interferences generated after the substrate absorbs light by providing an extra deep well bias, such that the response speed and the frequency bandwidth are greatly improved. The main body of the silicon photodiode can be constituted by various structures and the uniform electric field distribution can be attained by adopting symmetrical polygonal designs. The method of providing an extra deep well bias does not require other fabrication steps or particular post-processing for eliminating the slow diffusion carriers generated in the substrate and the response speed of the silicon photodiode can therefore be increased.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A silicon photodiode with a symmetry layout and a deep well bias in a CMOS technology, comprising:
a substrate;
a deep well disposed on the substrate, wherein a bias is provided to the deep well and a region above the deep well forms a main body of the silicon photodiode; and
a PN diode structure disposed in the region above the deep well,
wherein the silicon photodiode has a symmetrical surrounding structure,
wherein the deep well has an implanted conductive type and implanted regions of the PN diode structure with the implanted conductive type are not connected to the deep well, so that the bias provided to the deep well is different from a bias applied to the implanted regions of the PN diode structure with the implanted conductive type.

2. The silicon photodiode with the symmetry layout and the deep well bias in the CMOS technology as claimed in claim 1, wherein the substrate is a P-type substrate.

3. The silicon photodiode with the symmetry layout and the deep well bias in the CMOS technology as claimed in claim 1, wherein the deep well is an N-type deep well.

4. The silicon photodiode with the symmetry layout and the deep well bias in the CMOS technology as claimed in claim 3, wherein an N-type well is not connected to the N-type deep well inside the main body of the silicon photodiode.

5. The silicon photodiode with the symmetry layout and the deep well bias in the CMOS technology as claimed in claim 1, wherein the main body of the silicon photodiode comprises an N-type implant region, a P-type substrate region, and a P-type implant region.

6. The silicon photodiode with the symmetry layout and the deep well bias in the CMOS technology as claimed in claim 1, wherein a main body of the silicon photodiode comprises an N-type implant region, a P-type well, and a P-type implant region.

7. The silicon photodiode with the symmetry layout and the deep well bias in the CMOS technology as claimed in claim 1, wherein the main body of the silicon photodiode comprises an N-type implant region, a P-type substrate region, a P-type well, and a P-type implant region.

8. The silicon photodiode with the symmetry layout and the deep well bias in the CMOS technology as claimed in claim 1, wherein the symmetrical surrounding structure of the silicon photodiode is a symmetrical polygonal surrounding structure.

9. The silicon photodiode with the symmetry layout and the deep well bias in the CMOS technology as claimed in claim 8, wherein the symmetrical surrounding structure of the silicon photodiode is a symmetrical octagonal surrounding structure.

10. The silicon photodiode with the symmetry layout and the deep well bias in the CMOS technology as claimed in claim 1, wherein the symmetrical surrounding structure of the silicon photodiode is a circular surrounding structure.

11. The silicon photodiode with the symmetry layout and the deep well bias in the CMOS technology as claimed in claim 1, wherein the symmetrical surrounding structure has two semi portions separated from a center line of the symmetrical surrounding structure to also have a mirror symmetrical structure.

12. The silicon photodiode with the symmetry layout and the deep well bias in the CMOS technology as claimed in claim 11, wherein the deep well also has two semi portions corresponding to the two semi portions of the symmetrical surrounding structure.

13. The silicon photodiode with the symmetry layout and the deep well bias in the CMOS technology as claimed in claim 11, wherein the deep well is un-segmented corresponding to the two semi portions of the symmetrical surrounding structure.

* * * * *